(12) United States Patent
Ferrant

(10) Patent No.: US 7,057,916 B2
(45) Date of Patent: Jun. 6, 2006

(54) SMALL SIZE ROM

(75) Inventor: Richard Ferrant, Esquibien (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/717,223

(22) Filed: Nov. 19, 2003

(65) Prior Publication Data

US 2004/0264228 A1 Dec. 30, 2004

Related U.S. Application Data

(63) Continuation of application No. 10/296,421, filed as application No. PCT/FR01/01608 on May 23, 2001, now abandoned.

(51) Int. Cl.
*G11C 17/00* (2006.01)

(52) U.S. Cl. .......................... 365/94; 365/63; 365/104; 365/189.01

(58) Field of Classification Search ................. 365/94, 365/63, 104, 189.01
See application file for complete search history.

(56) References Cited

U.S. PATENT DOCUMENTS

| | | | |
|---|---|---|---|
| 4,495,602 A * | 1/1985 | Sheppard | .................... 365/104 |
| 4,651,305 A | 3/1987 | Davis | |
| 5,200,922 A * | 4/1993 | Rao | ....................... 365/185.09 |
| 5,331,588 A | 7/1994 | Narahara | |
| 5,408,148 A | 4/1995 | Pascucci et al. | |
| 5,877,982 A * | 3/1999 | Iwahashi | ................ 365/185.17 |
| 5,953,274 A * | 9/1999 | Iwahashi | ..................... 365/204 |
| 6,107,658 A * | 8/2000 | Itoh et al. | .................... 257/315 |
| 6,282,114 B1 * | 8/2001 | Hanriat et al. | .............. 365/103 |
| 6,324,101 B1 * | 11/2001 | Miyawaki | .............. 365/185.28 |

OTHER PUBLICATIONS

International Search Report from patent application No. PCT/FR01/01608 filed May 23, 2001.
Patent Abstracts of Japan, vol. 1995, No. 08, Sep. 29, 1995 & JP 07 130165 A May 19, 1995.

* cited by examiner

*Primary Examiner*—Richard Elms
*Assistant Examiner*—Toan Le
(74) *Attorney, Agent, or Firm*—Lisa K. Jorgenson; James H. Morris; Wolf, Greenfield & Sacks, P.C.

(57) ABSTRACT

The invention concerns a ROM circuit (40) including columns of storage cells, each column being connected to a bit site (BLi, BLi+1), wherein the columns are arranged in groups of two adjacent columns, each column of a group capable of being selectively activated relative to the other column of the group, thereby enabling the elimination of a connection to the ground of columns and the design of efficient reading amplifiers.

29 Claims, 5 Drawing Sheets

SMALL SIZE ROM

RELATED APPLICATIONS

This application is a continuation of U.S. application Ser. No. 10/296,421, filed on Nov. 22, 2002 now abandoned entitled "ROM of Reduced Size," which is incorporated herein by reference in its entirety.

Background Of The Invention

1. Field of the Invention

The present invention relates to non-volatile memories, also called ROMs (read-only memories).

2. Discussion of the Related Art

In a ROM, the information is stored once and for all upon manufacturing of the memory. Such a memory includes several blocks of memory cells organized in columns and rows, and can only be used for reading.

In FIG. 1, a block of a ROM 10 includes memory cells 1 forming two columns $A_i$ and $A_{i+1}$, respectively connected to bit lines $BL_i$ and $BL_{i+1}$. Memory cells 1 of the shown block are also arranged according to sixteen rows, a memory cell being present at each intersection of a column and of a row. Each memory cell 1 includes or not a transistor 2. The three gate, drain, and source electrodes of each transistor 2, are respectively connected to a word line $WL_0$ to $WL_{15}$, to a bit line $BL_i$, $BL_{i+1}$, and to ground (GND). When cell 1 includes no transistor 2, the corresponding word line simply crosses the column with no action thereupon.

Each column also includes a selection transistor 5 controlled by an activation line BS ("Block Select") common to all the columns in the block. When the activation line receives a high voltage, generally supply voltage VDD, also corresponding to a logic "1", all transistors 5 of the block columns are on, which puts in communication each column of the block with its respective bit line. An amplifier 6 connected to each bit line $BL_i$, enables reading the stored information.

It should be noted that "column" here designates the assembly formed by a selection transistor 5 and all the memory cells coupled to this selection transistor. Each column has an end connected to a bit line. The other end of each column is grounded, either via the source of the transistor of the last memory cell, if said cell includes one (case of column $A_i$), or directly if the last cell includes no transistor (case of column $A_{i+1}$). It should also be noted that bit lines $BL_i$, $BL_{i+1}$ continue beyond the shown block for connection to other columns of other blocks of memory 10.

For reading from a row of a block of memory 10, the bit lines are first precharged to a high voltage, generally supply voltage VDD, and activation line BS of the block is brought to "1" (VDD). Then, the word line of the selected row is set to "1", the other word lines being at "0" (GND). All the transistors of the unselected rows, receiving a null voltage on their gates, will be off and will have no influence upon the read information. However, all the transistors in the selected row will be on, which results in discharging the bit line to which they are connected. Thus, if the selected cell 1 includes a transistor 2, the bit line is discharged and a "0" is read by amplifier 6. If the cell includes no transistor 2, the bit line will not be discharged and a "1" will be read at the output of amplifier 6. For example, if line $WL_{15}$ is selected, amplifier 6 of bit line $BL_i$ will provide a "0" and the amplifier of bit line $BL_{i+1}$ will provide a "1".

FIG. 2A illustrates another type of ROM 20. In memory 20, the memory cell columns will be formed of an assembly of transistors in series. Each column $A_i$, $A_{i+1}$ includes a selection transistor 5 enabling activation of the column to which it belongs and transistors 10 corresponding to the memory cells. One end of each column is connected to a bit line $BL_i$, $BL_{i+1}$, and the other end of the column is connected to ground (GND). To represent a "0", transistor 10 is short-circuited by a conductive link 11 between its source and its drain. To represent a "1", transistor 10 is not short-circuited. Each selection transistor 5 is controlled by an activation line BS common to all columns in the block, and each bit line is connected to a read amplifier 6. The bit lines continue, beyond the shown block, towards other memory blocks.

To read from a row of a block of memory 20, the bit lines are first precharged to a high voltage, generally VDD, and activation line BS of the block is brought to "1" (VDD). All transistors 5 of the considered block are then on. Then, a row is selected by bringing the corresponding word line to a low potential, generally the ground potential, corresponding to logic "0". All the other word lines are brought to a high potential. All the transistors in the unselected rows are then on and present no obstacle to the passing of a current through the column. The transistors of the selected row, having their gate to potential 0, are all off. If the transistor is not short-circuited, as is the case for transistor 10 located at the intersection of bit line $BL_i$ and of word line $\overline{WL}_{15}$, the transistor is off and it will prevent the bit line discharge. The corresponding bit line will thus remain at the high potential and the corresponding read amplifier 6 will provide a "1". However, if the transistor is short-circuited, as is the case for the transistor 10 located at the intersection of bit line $BL_{i+1}$ and of word line $\overline{WL}_{15}$, the fact that this transistor is off does not disturb the current conduction in the column connected to bit line $BL_{i+1}$ which will discharge to ground via all the other on transistors in the column. The corresponding amplifier 6 will thus read a "0".

The circuit of FIG. 2A is often preferred since it is easy to implement in integrated technology.

FIG. 2B shows a simplified top view of memory 20 of FIG. 2A, made in the form of an integrated circuit. Memory 20 is made on a substrate 21 including two elongated active areas 22 and 22'. Areas 22, 22', for example N doped, are insulated from each other and respectively correspond to the drains and to the sources of series transistors 10 of columns $A_i$, $A_{i+1}$ of FIG. 2A. Polysilicon strips 24 pass on active areas 22 and 22' while being insulated therefrom. Strips 24 form word lines $\overline{WL}_0$ to $\overline{WL}_{15}$. They form, at each of their intersections with areas 22, 22', the gate of a transistor 10. This results in the forming of a chain of transistors 10 in series, along areas 22, 22'. For each block, a specific strip 24' forms activation line BS and forms selection transistor 5. Each column includes, at one end, a contacting area $25_i$, $25_{i+1}$ for the corresponding bit line and, at the other end, a contacting area M for connection to the ground. When a conductive link must be formed to short-circuit a transistor, as is the case for the transistor 10 located at the intersection of word lines $\overline{WL}_{15}$ and of active area 22', contacting areas 26 and 26' are provided on either side of the gate of the considered transistor for connection to an upper metallization level.

ROMs such as illustrated in FIGS. 1, 2A, and 2B have disadvantages.

For example, the ground contact, which is at one end of the active area generally requires an additional metallization level, which increases the size, the manufacturing times and the costs.

Also, the quality of the read amplifiers is mediocre. As they are located at the end of the bit lines, the read amplifiers can indeed only occupy the width thereof. They are accordingly small and cannot be very elaborately designed. For example, their response time is low, which limits the maximum frequency of use of the memory, and they consume significant power.

SUMMARY OF THE INVENTION

An object of the present invention is to provide a ROM-type memory of reduced size.

Another object of the present invention is to provide a ROM including sophisticated read amplifiers having reduced power consumption.

To achieve these objects as well as others, the present invention provides a ROM circuit including memory cell columns, each column being connected to a bit line, in which the columns are arranged in groups of two adjacent columns, each column in a group being selectively activable or inactivable with respect to the other column in the group by means of an activation line, characterized in that each column in a group is connected by one end to the activation line of the other column in the group.

According to an embodiment of the present invention, the activation line of a column is brought to the ground potential to deactivate said column.

According to an embodiment of the present invention, a column comprises a plurality of memory cells in series, each memory cell comprising a MOS transistor, the drain, respectively the source, of which is coupled either to the source, respectively the drain, of an adjacent memory cell, or to an end of the column.

According to an embodiment of the present invention, each column of a group comprises a selection means capable of selectively activating/deactivating said column, controlled by the activation line of the column.

According to an embodiment of the present invention, the selection means of a column comprises a MOS transistor in series with the memory cells of the column and arranged at the end of the column not connected to the activation line of the other column of the group.

According to an embodiment of the present invention, the circuit includes an amplifier connected to the bit lines connected to the two columns of a same group.

According to an embodiment of the present invention, the amplifier includes a means for invalidating the information present on the bit line connected to the deactivated column in the group.

According to an embodiment of the present invention, the amplifier includes a means for lowering the voltage present on the bit line connected to the deactivated column in the group.

BRIEF DESCRIPTION OF THE DRAWINGS

The foregoing objects, features and advantages of the present invention, will be discussed in detail in the following non-limiting description of specific embodiments in connection with the accompanying drawings, in which.

Detailed Description

The same elements have been referred to with the same references in the different drawings.

According to the present invention, the columns of a ROM circuit are arranged in groups of two adjacent columns. Each of the columns of a group includes a selection means, controllable by a specific activation line. The activation line enables selection either of all the columns of even rank, or of all the columns of odd rank of a memory block. According to the rank of the selected columns, data coming either from all the bit lines of even rank, or from all the bit lines of odd rank, will be obtained in read mode.

Figure 1:
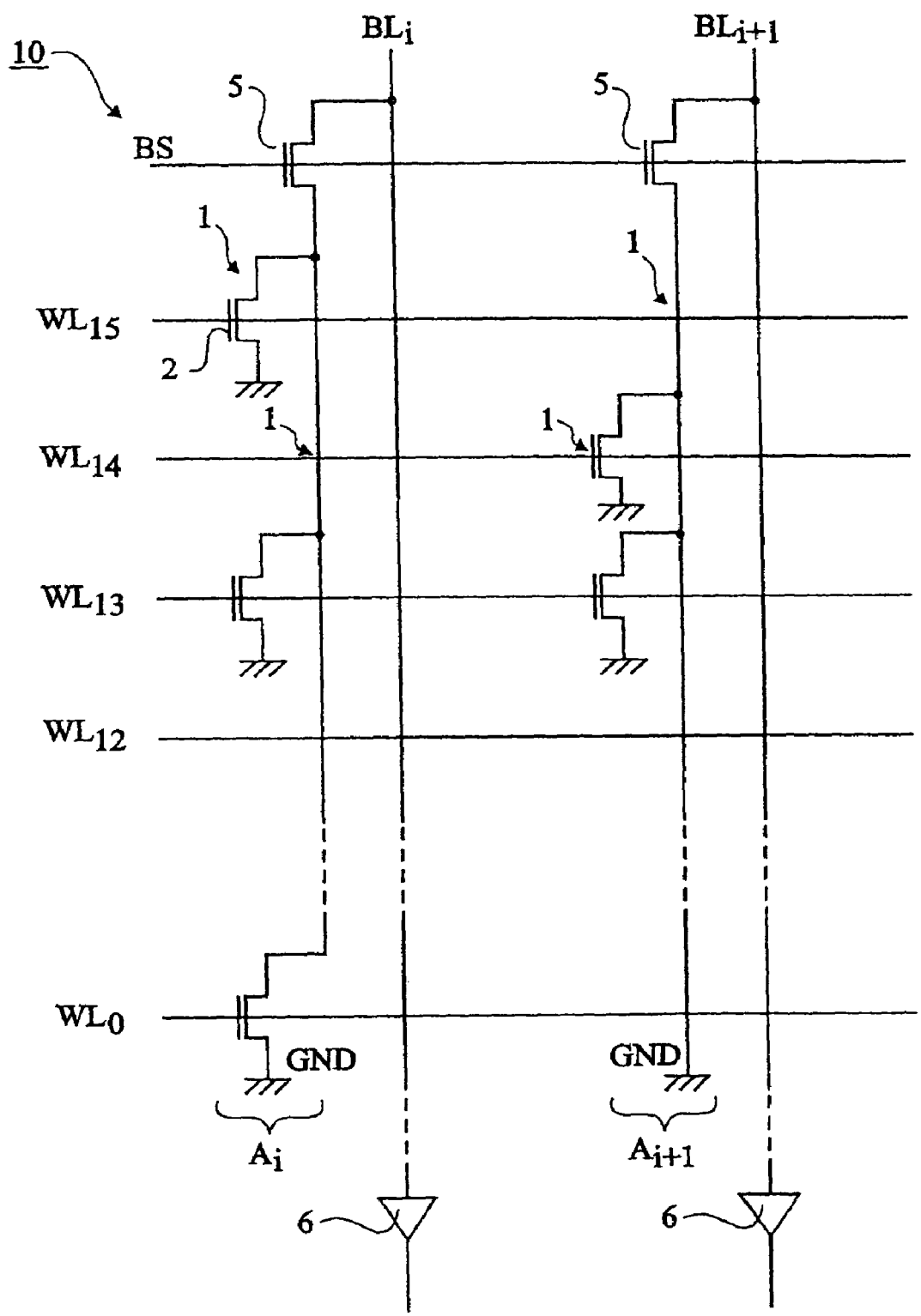
FIG. 1, previously described, schematically shows a first example of a conventional ROM.
Figure 2A:
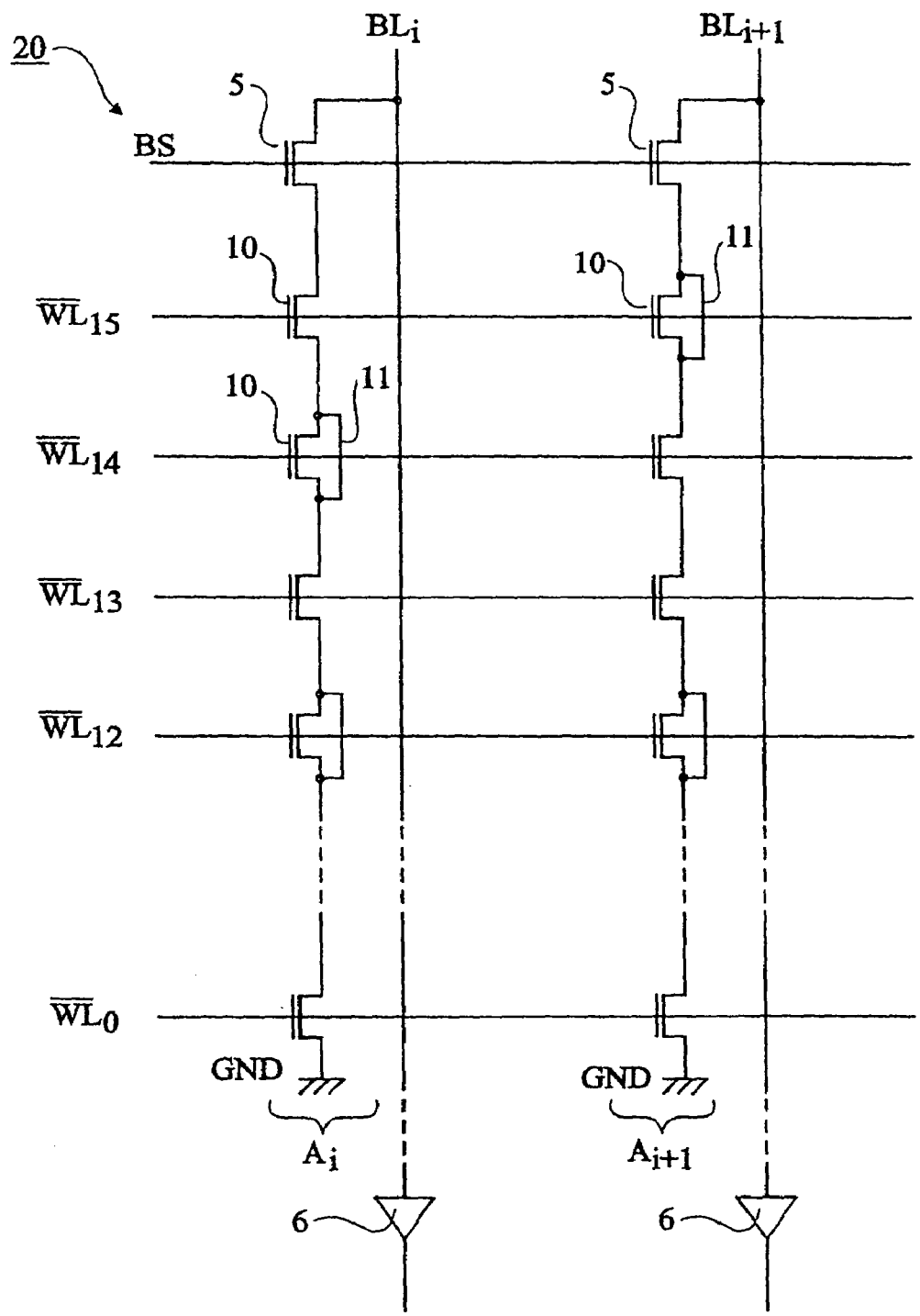
FIGS. 2A and 2B, previously described, schematically show, respectively, the electric diagram and a top view in integrated form of a second example of a conventional ROM.
Figure 2B:
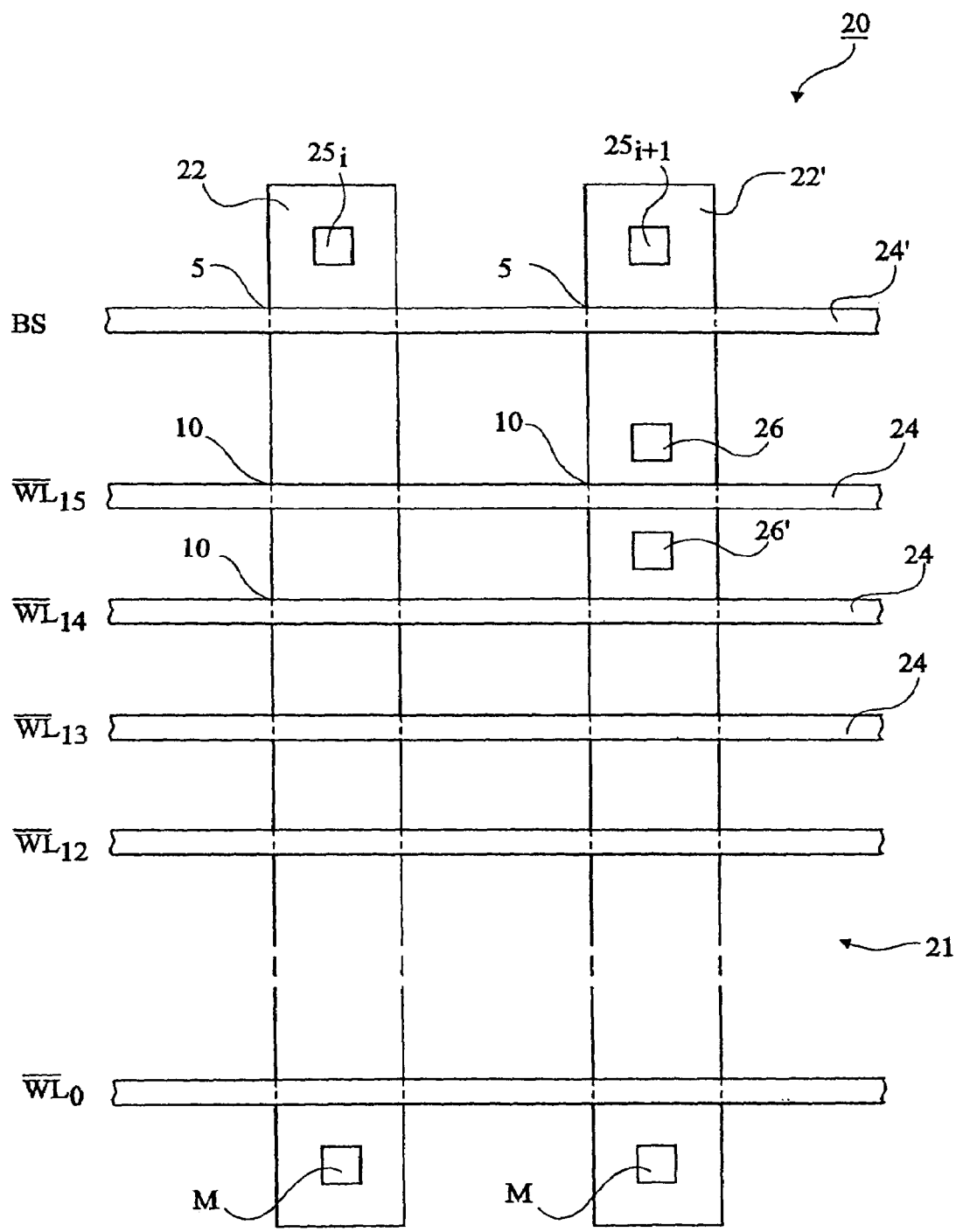
Figure 3:
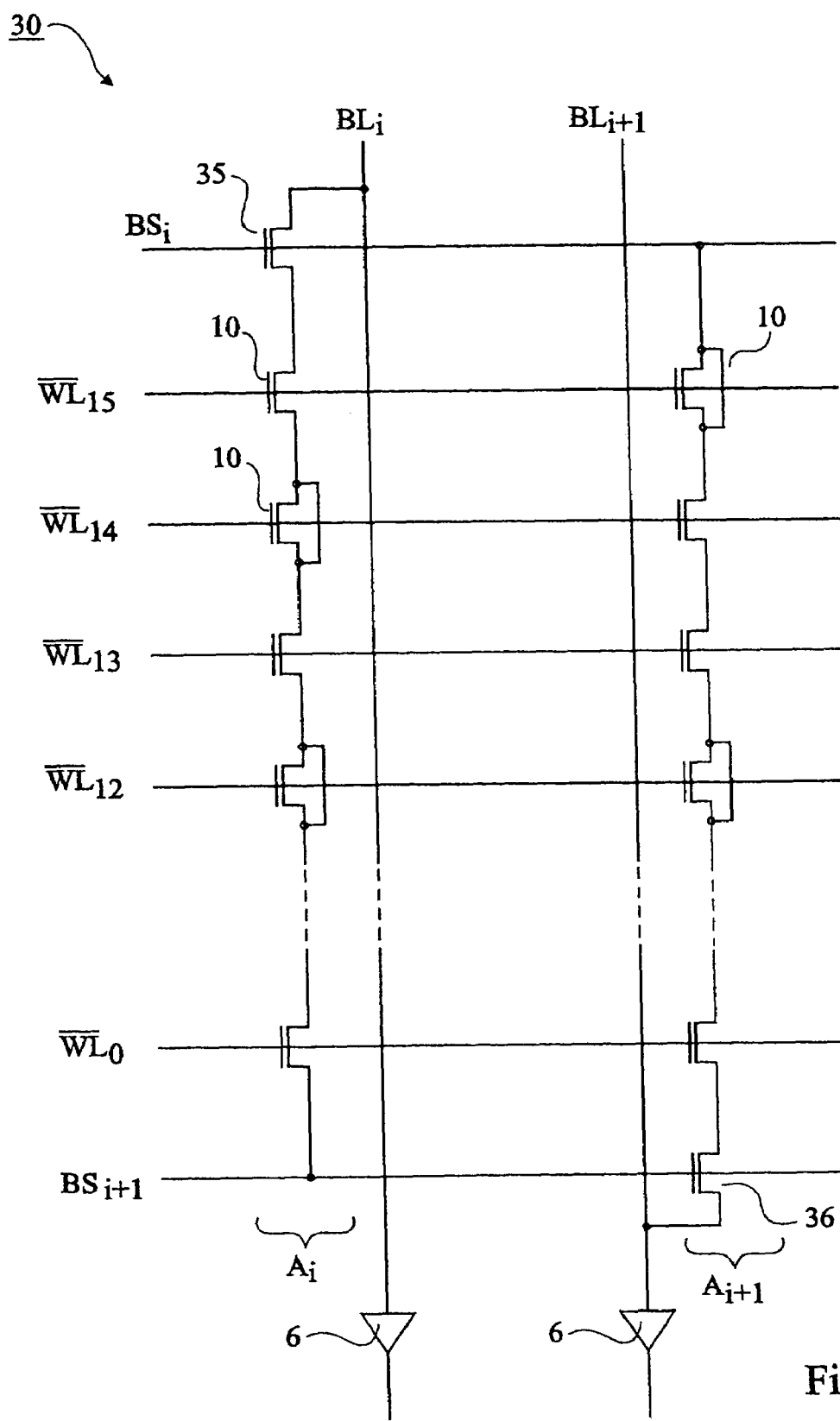
FIG. 3 schematically shows a first embodiment of the present invention.

In FIG. 3, a ROM 30 is shown with two adjacent columns $A_i$, $A_{i+1}$, respectively connected to bit lines $BL_i$ and $BL_{i+1}$. Each column includes transistors 10, short-circuited or not, corresponding to the memory cells. Column $A_i$ further includes, at one end, a selection transistor 35, controlled by an activation line $BS_i$. Column $A_i$ is connected to bit line $BL_i$ by the end including transistor 35. Similarly, column $A_{i+1}$ includes, at one end, a selection transistor 36 controlled by an activation line $BS_{i+1}$. Column $A_{i+1}$ is connected to bit line $BL_{i+1}$ by the end including transistor 36. Further, the end of column $A_i$ that does not include transistor 35 is connected to activation line $BS_{i+1}$ and the end of column $A_{i+1}$ that does not include transistor 36 is connected to activation line $BS_i$.

According to the present invention, the two columns $A_i$, $A_{i+1}$ form a group of two selectively-activated adjacent columns, that is, when a column in the group is activated, the other one is deactivated, and vice versa. For this purpose, transistors 35 and 36 are selectively controlled, that is, activation lines $BS_i$ and $BS_{i+1}$ receive complementary signals. Thus, when activation line $BS_i$ is at "1", activation line $BS_{i+1}$ is at "0" and transistors 35 and 36 are respectively on and off. Only column $A_i$ is then activated. Indeed, the on transistor 35 puts in communication the memory cells of columns $A_i$ with bit line $BL_i$ and the end of column $A_i$ opposite to transistor 35 is at the ground potential, since it is connected to $BS_{i+1}$, then at "0". Conversely, when activation line $BS_{i+1}$ is at "1", line $BS_i$ is at "0" and only column $A_{i+1}$ is activated.

Thus, in the memory of FIG. 3, the setting to a null potential of the end of the columns is performed by connecting the end of a column of a group to the activation line of the other column in the group. This is possible according to the present invention since, when a column of a group is activated, the voltage on the corresponding activation line is at VDD and the voltage on the activation line of the other column in the group is equal to zero. Accordingly, the connection of the source of the last transistor of a column in a group to the activation line of the selection means of the other column in the group does not modify the memory operation. The ground connection of the columns has become useless. This can avoid an additional metallization layer and make the memory more compact while decreasing its manufacturing costs.

To easily make the connection of the last transistor in a column to the activation line of the other column in the group, the selection means of the second column in a group will preferably be located on the side opposite to the selection means of the first column, as illustrated in FIG. 3. However, as an alternative, it is possible to eliminate a ground connection by arranging the two activation lines $BS_i$ and $BS_{i+1}$ side by side, those skilled in the art defining the modifications to be made to the diagram of FIG. 3.

The fact of providing the grouping by two of the adjacent columns and of selectively activating them also enables having read amplifiers with higher performance.

Figure 4:
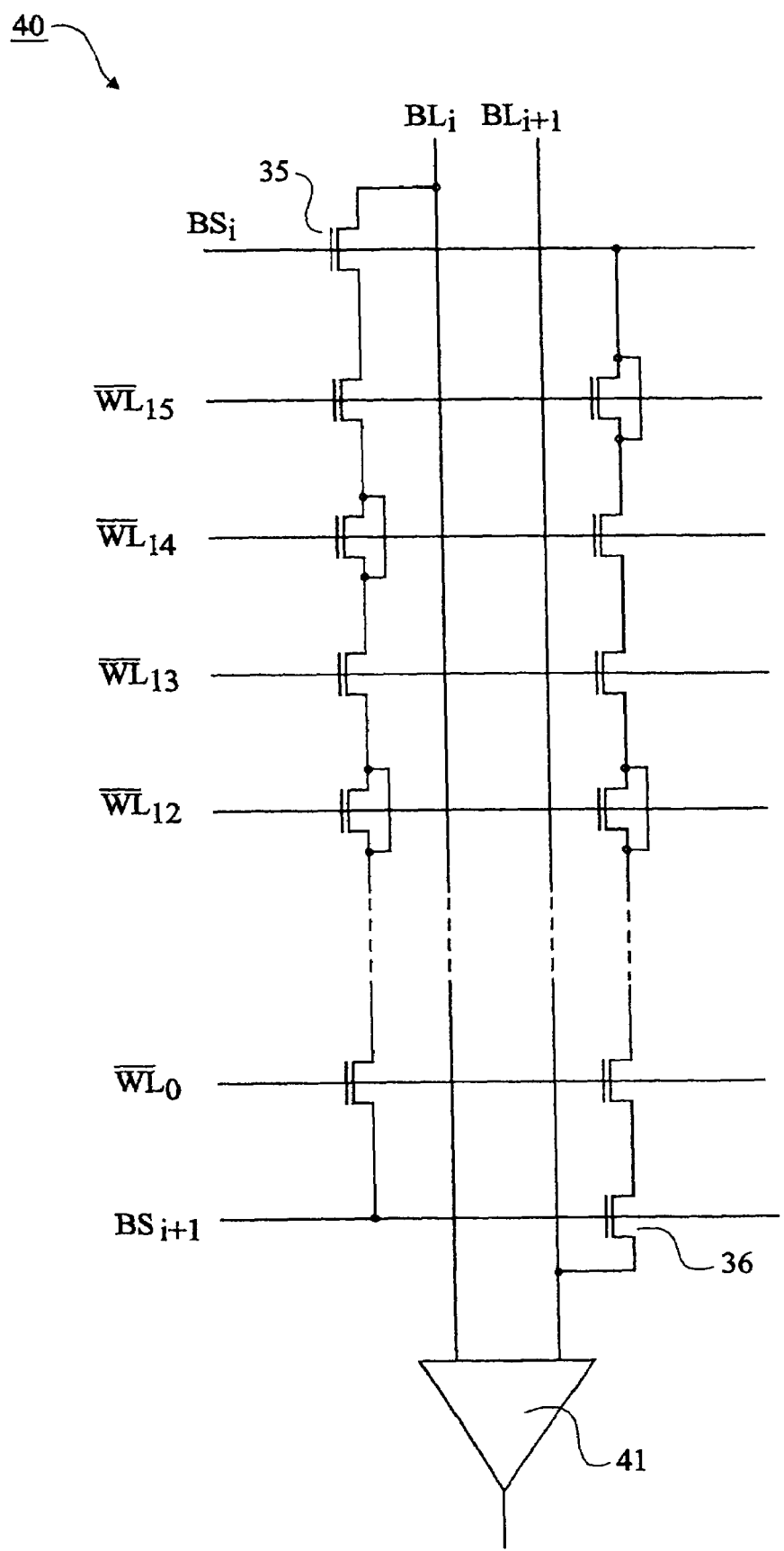
FIG. 4 schematically shows a second embodiment of the present invention.

FIG. 4 illustrates a second embodiment of the present invention. In FIG. 4, a ROM 40 includes the main elements of memory 30. Further, an amplifier 41 replaces the two read amplifiers 6 of FIG. 3. Amplifier 41 has two inputs, respectively connected to bit lines $BL_i$ and $BL_{i+1}$.

The replacing by amplifier 41 is made possible by the grouping by two of the adjacent columns. Indeed, in read mode, a single one of the two columns in a group is activated and, accordingly, a single read amplifier is necessary per group.

Read amplifier 41 can thus occupy up to two times as much room as each of prior art amplifiers 6. In practice, it will generally be a little smaller than two amplifiers 6, which saves space. Its design can be neater and, in particular, the frequency response of the amplifier can be faster, which, as it decreases its response time, enables increasing the maximum frequency of use of memory 40. Since it is faster, amplifier 41 can further be activated for a shorter duration in read mode and it will consume less power. Since there are many read amplifiers in a memory, for example 512 or 1024 per block, the present invention also enables significantly decreasing the power consumption of the memory.

Amplifier 41 can operate in various ways. For example, the input corresponding to the deactivated column can be invalidated, the amplifier only effectively receiving the information to be read.

Thus, amplifier 41 can include differential stages coupled to the two bit lines $BL_i$ and $BL_{i+1}$, which then perform a complementary function, somewhat like in the case of a DRAM. In a read operation, the bit lines are first precharged to any voltage, for example VDD. Then, the selected column in the group provides a "1" or a "0" and, according to the case, the corresponding bit line remains precharged at VDD or discharges to 0. For the differential stages of amplifier 41 to properly discriminate a 1, the voltage will have to be lowered on the bit line of the deactivated column, for example by being brought down to VDD/2. Such a modification is within the abilities of those skilled in the art and will not be detailed any further.

Of course, the present invention is likely to have various alterations, modifications, and improvements which will readily occur to those skilled in the art.

Thus, the high voltage has been described as being a supply voltage VDD, but another value may be used. Similarly, the low potential has been described as being the ground potential, but it can be a virtual ground associated with the memory, distinct from the ground of other circuits linked to the memory.

Also, the functions of the high and low voltages and of the logic "1s" and "0s" may be inverted without departing from the field of the present invention.

Also, even though the described embodiments provide arranging the columns of the blocks of a ROM in groups of two adjacent columns, it is within the abilities of those skilled in the art to arrange the columns in groups of any number n of adjacent columns, n selection means then enabling activation of a single column at a time.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A ROM circuit including memory cell columns, each column being connected to a bit line, wherein the columns are arranged in groups of two adjacent columns, each column in a group being selectable with respect to the other column in the group by an activation line, wherein each column in a group is connected by one end to another activation line that selects the other column in the group.

2. The memory circuit of claim 1, wherein the activation line of a column is brought to a ground potential to deactivate said column.

3. The memory circuit of claim 1, wherein a column comprises a plurality of memory cells in series, each memory cell comprising a MOS transistor, a drain, respectively a source, of which is coupled either to a source, respectively a drain, of an adjacent memory cell, or to an end of the column.

4. The memory circuit of claim 3, wherein each column of a group comprises a selection means capable of selectively activating/deactivating said column, controlled by the activation line of the column.

5. The memory circuit of claim 4, wherein the selection means of a column comprises a MOS transistor in series with the memory cells of the column and arranged at the end of the column not connected to the activation line of the other column of the group.

6. The memory circuit of claim 1, including an amplifier connected to the bit lines connected to the two columns of a same group.

7. The memory circuit of claim 6, wherein the amplifier includes a means for invalidating the information present on the bit line connected to the deactivated column in the group.

8. The memory circuit of claim 6, wherein the amplifier includes a means for lowering the voltage present on the bit line connected to the deactivated column in the group.

9. A memory circuit, comprising:
a first column of memory cells coupled to a first bit line;
a second column of memory cells coupled to a second bit line;
a first block select line that provides a first signal to select the first column, the first block select line being coupled to the first column and the second column; and
a second block select line that provides a second signal that is complementary to the first signal, the second block select line being coupled to the first column and the second column.

10. The memory circuit of claim 9, wherein the first block select line is coupled to a gate of a first column selection transistor, the first column selection transistor being in the first column of memory cells.

11. The memory circuit of claim 10, wherein the first column selection transistor is in series with the first column of memory cells.

12. The memory circuit of claim 9, wherein the first block select line is coupled to an end memory cell in the second column of memory cells.

13. The memory circuit of claim 12, wherein the end memory cell comprises a MOS transistor and the first block select line is coupled to a source and/or drain of the MOS transistor.

14. The memory circuit of claim 9, wherein the second block select line is coupled to a gate of a second column selection transistor, the second column selection transistor being in the second column of memory cells.

15. The memory circuit of claim 9, wherein the second block select line is coupled to an end memory cell in the first column of memory cells.

16. The memory circuit of claim 9, wherein the first block select line is coupled to an end memory cell in the second column of memory cells, and wherein the second block select line is coupled to an end memory cell in the first column of memory cells, the end memory cell in the second column of memory cells and the end memory cell in the first column of memory cells being on opposite column ends.

17. The memory circuit of claim 9, wherein the first bit line and the second bit line are both coupled to an amplifier.

18. The memory circuit of claim 17, wherein the first block select line and the second block select line are both coupled to respective inputs of a single differential amplifier.

19. The memory circuit of claim 9, wherein the first column of memory cells is adjacent to the second column of memory cells.

20. The memory circuit of claim 9, wherein the first block select line provides a ground voltage to the second column of memory cells when the second column of memory cells is selected.

21. The memory circuit of claim 9, wherein the second block select line provides a ground voltage to the first column of memory cells when the first column of memory cells is selected.

22. The memory circuit of claim 9, wherein odd columns of memory cells in the memory circuit are selected by the first block select line, and wherein even columns of memory cells in the memory circuit are selected by the second block select line.

23. The memory circuit of claim 9, wherein the first block select line provides a logic 1 signal to select the first column of memory cells.

24. The memory circuit of claim 9, wherein the first block select line provides a logic 1 signal when the second block select line provides a logic 0 signal.

25. The memory circuit of claim 9, wherein the first block select line provides a logic 0 signal when the second block select line provides a logic 1 signal.

26. The memory circuit of claim 9, wherein a voltage of the second bit line is brought to an intermediate voltage when the first column of memory cells is selected.

27. The memory circuit of claim 26, wherein the intermediate voltage is approximately Vdd/2.

28. The memory circuit of claim 26, wherein the second bit line is coupled to an amplifier that reduces the voltage of the second bit line to the intermediate voltage when the first column of memory cells is selected.

29. The memory circuit of claim 9, wherein the memory circuit is a read-only-memory circuit.

* * * * *